United States Patent
Slater, Jr. et al.

(10) Patent No.: US 6,888,167 B2
(45) Date of Patent: May 3, 2005

(54) FLIP-CHIP BONDING OF LIGHT EMITTING DEVICES AND LIGHT EMITTING DEVICES SUITABLE FOR FLIP-CHIP BONDING

(75) Inventors: David B. Slater, Jr., Raleigh, NC (US); Jayesh Bharathan, Santa Barbara, CA (US); John Edmond, Cary, NC (US); Mark Raffetto, Santa Barbara, CA (US); Anwar Mohammed, San Jose, CA (US); Peter S. Andrews, Greensboro, NC (US); Gerald H. Negley, Hillsborough, NC (US)

(73) Assignees: Cree, Inc., Durham, NC (US); Cree Microwave, Inc., Sunnyvale, CA (US)

( * ) Notice: Subject to any disclaimer, the term of this patent is extended or adjusted under 35 U.S.C. 154(b) by 135 days.

(21) Appl. No.: 10/185,252

(22) Filed: Jun. 27, 2002

(65) Prior Publication Data

US 2003/0045015 A1  Mar. 6, 2003

Related U.S. Application Data

(60) Provisional application No. 60/307,311, filed on Jul. 23, 2001.

(51) Int. Cl.[7] .............................................. H01L 29/267
(52) U.S. Cl. ......................................... 257/81; 257/676
(58) Field of Search ........................... 257/81, 79, 91, 257/676, E33.001, E33.026, E33.03, E33.055, E33.062

(56) References Cited

U.S. PATENT DOCUMENTS 5,046,161 A   9/1991   Takada ........................ 357/69
5,060,027 A   10/1991  Hart et al. .................... 357/17

(Continued)

FOREIGN PATENT DOCUMENTS

EP   0589524 A2   3/1994
EP   0843365      5/1998

(Continued)

OTHER PUBLICATIONS

Copy of International Search Report for PCT/US02/23120, dated May 16, 2003.

(Continued)

*Primary Examiner*—W. David Coleman
(74) *Attorney, Agent, or Firm*—Myers Bigel Sibley & Sajovec

(57) ABSTRACT

Light emitting device die having a mesa configuration on a substrate and an electrode on the mesa are attached to a submount in a flip-chip configuration by forming predefined pattern of conductive die attach material on at least one of the electrode and the submount and mounting the light emitting device die to the submount. The predefined pattern of conductive die attach material is selected so as to prevent the conductive die attach material from contacting regions of having opposite conductivity types when the light emitting device die is mounted to the submount. The predefined pattern of conductive die attach material may provide a volume of die attach material that is less than a volume defined by an area of the electrode and a distance between the electrode and the submount. Light emitting device dies having predefined patterns of conductive die attach material are also provided. Light emitting devices having a gallium nitride based light emitting region on a substrate, such as a silicon carbide substrate, may also be mounted in a flip-chip configuration by mounting an electrode of the gallium nitride based light emitting region to a submount utilizing a B-stage curable die epoxy. Light emitting device dies having a B-stage curable die epoxy are also provided.

35 Claims, 8 Drawing Sheets

U.S. PATENT DOCUMENTS

| | | | |
|---|---|---|---|
| 5,117,279 A | 5/1992 | Karpman | 357/72 |
| 5,118,584 A | 6/1992 | Evans et al. | 430/313 |
| 5,438,477 A | 8/1995 | Pasch | 361/689 |
| 5,506,451 A | 4/1996 | Hyugaji | 257/778 |
| 5,672,542 A | 9/1997 | Schwiebert | 437/183 |
| 5,694,482 A | 12/1997 | Maali et al. | 382/151 |
| 5,760,479 A | 6/1998 | Yang et al. | 257/778 |
| 5,773,882 A | 6/1998 | Iwasaki | 257/692 |
| 6,057,222 A | 5/2000 | Pahl et al. | 438/612 |
| 6,146,984 A | 11/2000 | Leibovitz et al. | 438/613 |
| 6,189,772 B1 | 2/2001 | Hembree | 228/254 |
| 6,213,789 B1 | 4/2001 | Chua et al. | 439/81 |
| 6,214,733 B1 | 4/2001 | Sickmiller | 438/691 |
| 6,222,279 B1 | 4/2001 | Mis et al. | 257/779 |
| 6,224,690 B1 | 5/2001 | Andricacos | 148/400 |
| 6,498,355 B1 | 12/2002 | Harrah et al. | 257/99 |
| 6,614,056 B1 * | 9/2003 | Tarsa et al. | 257/91 |
| 6,657,236 B1 * | 12/2003 | Thibeault et al. | 257/98 |
| 2001/0006235 A1 | 7/2001 | Ozawa | 257/79 |
| 2001/0032985 A1 | 10/2001 | Bhat et al. | 257/88 |
| 2002/0068373 A1 * | 6/2002 | Lo et al. | 438/33 |
| 2002/0139987 A1 | 10/2002 | Collins, III et al. | 257/88 |
| 2004/0026709 A1 * | 2/2004 | Bader et al. | 257/103 |

FOREIGN PATENT DOCUMENTS

| | | |
|---|---|---|
| EP | 1020935 A2 | 7/2000 |
| FR | 2610451 | 8/1988 |
| JP | 55148477 | 5/1979 |
| JP | 55009442 | 1/1980 |
| JP | 56064484 | 6/1981 |
| JP | 02206136 | 8/1990 |
| JP | 04152645 | 5/1992 |
| JP | 05029364 | 2/1993 |
| JP | 08172219 | 12/1994 |
| WO | WO 01/47039 | 6/2001 |
| WO | WO 01/69978 A1 | 9/2001 |

OTHER PUBLICATIONS

Copy of International Search Report for PCT/US02/23067, dated Jun. 4, 2003.

Abstract, "Thermosonic bonding: an alternative to area–array solder connections," Sa Yoon Kang, Teh–hua Ju, and Y. C. Lee, Electronic Components and Technology Conference, Florida, Jun. 2–4, 1993, XP–002241923.

Abstract, "Light emitting diode holder for various electrical instrument LED mounting," A. N. Soldatenkov, Derwent Publications Ltd, London, GB, AN 1995–013018, Jul. 15, 1993, XP–002241924.

Epoxy Technology: Products—B Stage. http://www.epotek.com/b stage.html. Feb. 27, 2002.

B–Definitions: B Stage. *http://www.isl–garnetuah.edu/Composites/b.html*. Feb. 27, 2002.

* cited by examiner

FLIP-CHIP BONDING OF LIGHT EMITTING DEVICES AND LIGHT EMITTING DEVICES SUITABLE FOR FLIP-CHIP BONDING

RELATED APPLICATIONS

The present application claims priority from U.S. Provisional Patent Application Ser. No. 60/307,311 entitled "FLIP CHIP BONDING OF LIGHT EMITTING DIODES" and filed Jul. 23, 2001, the disclosure of which is incorporated herein by reference as if set forth fully.

FIELD OF THE INVENTION

The present invention relates to semiconductor devices, and more particularly to semiconductor devices mounted to a submount in a flip-chip configuration.

BACKGROUND OF THE INVENTION

GaN-based light emitting diodes (LEDs) typically comprise an insulating, semiconducting or conducting substrate such as sapphire or SiC on which a plurality of GaN-based epitaxial layers are deposited. The epitaxial layers comprise an active region having a p-n junction that emits light when energized. A typical LED is mounted substrate side down onto a submount, also called a package or lead frame (hereinafter referred to as a "submount"). FIG. 1 schematically illustrates a conventional LED having an n-type SiC substrate 10, an active region 12 comprising an n-GaN-based layer 14 and a p-GaN-based layer 16 grown on the substrate and patterned into a mesa. A metal p-electrode 18 is deposited on and electrically coupled to the p-GaN layer 16 and a wire bond connection 28 is made to a bond pad 20 on the p-electrode 18. An n-electrode 22 on and electrically coupled to the conductive substrate is attached to metallic submount 24 using a conductive epoxy 26. In the conventional process, the conductive epoxy 26 (usually silver epoxy) is deposited on the submount and the LED is pressed into the epoxy 26. The epoxy is then heat cured which causes it to harden, providing a stable and electrically conductive mount for the LED chip. Light generated in the active region 12 is directed up and out of the device. However, a substantial amount of the generated light may be transmitted into the substrate and partially absorbed by the epoxy 26.

Flip-chip mounting of LEDs involves mounting the LED onto the submount substrate side up. Light is then extracted and emitted through the transparent substrate. Flip chip mounting may be an especially desirable technique for mounting SiC-based LEDs. Since SiC has a higher index of refraction than GaN, light generated in the active region does not internally reflect (i.e. reflect back into the GaN-based layers) at the GaN/SiC interface. Flip chip mounting of SiC-based LEDs may offer improved light extraction when employing certain chip-shaping techniques known in the art. Flip chip packaging of SiC LEDs may have other benefits as well, such as improved heat extraction/dissipation, which may be desirable depending on the particular application for the chip.

One problem with flip-chip mounting is illustrated in FIG. 2. Namely, when a chip is flip-chip mounted on a conductive submount or package conventional techniques may not be possible. Conventionally, a conductive die attach material 26, such as silver epoxy, is deposited on the chip and/or on the submount 24, and the chip is pressed onto the submount 24. This can cause the viscous conductive die attach material 26 to squeeze out and make contact with the n-type layers 14 and 10 in the device, thereby forming a Schottky diode connection that shunts the p-n junction in the active region with predictably undesirable results. Thus, new techniques may be needed for flip-chip mounting of LEDs.

SUMMARY OF THE INVENTION

Embodiments of the present invention provide for mounting a light emitting device having a gallium nitride based light emitting region on a silicon carbide substrate in a flip-chip configuration by mounting an electrode of the gallium nitride based light emitting region to a submount utilizing a B-stage curable die epoxy.

In particular embodiments of the present invention, the electrode is mounted to the submount by forming a predefined pattern of the B-stage curable die epoxy on the electrode, the predefined pattern covering only a predefined portion of the electrode. The electrode of the gallium nitride based light emitting region is attached to the submount utilizing the predefined pattern of the B-stage curable die epoxy. The predefined pattern of B-stage curable die epoxy may be provided by applying the B-stage curable die epoxy to the electrode by screen printing. Preferably, the screen printing provides a resolution of application of the B-stage curable die epoxy of about 4 mils.

The predefined pattern of B-stage curable die epoxy may also be provided by dispensing the B-stage epoxy onto desired locations of the electrode. Furthermore, the predefined pattern of B-stage curable die epoxy can be provided by coating the electrode with a B-stage epoxy and selectively removing B-stage epoxy from the electrode to provide the predefined pattern. The B-stage epoxy may be selectively removed by laser scribing the B-stage epoxy to selectively remove epoxy to provide the predefined pattern. If the B-stage epoxy is a photo-sensitive B-stage epoxy the B-stage epoxy may be selectively removed utilizing photolithography to provide the predefined pattern. The predefined pattern of B-stage curable die epoxy may also be provided by pin transferring the B-stage epoxy to locations on the electrode to provide the predefined pattern.

In further embodiments of the present invention, forming a predefined pattern of B-stage curable die epoxy is followed by pre-curing the B-stage epoxy. The pre-curing of the B-stage epoxy can be provided by pre-curing the B-stage epoxy utilizing a temperature of from about 50 to about 150° C. In particular, the B-stage epoxy can be pre-cured utilizing a temperature of about 85° C. Furthermore, the electrode of the gallium nitride based light emitting region may be attached to the submount utilizing the predefined pattern of the B-stage curable die epoxy by placing the light emitting device on the submount and heating the B-stage epoxy to a final curing temperature so as to cause the B-stage epoxy to re-flow. The B-stage epoxy may be heated to a temperature of at least about 150° C.

In particular embodiments, the predefined pattern is a single nodule of B-stage epoxy on the electrode. The predefined pattern may also be a plurality of bumps of B-stage epoxy on the electrode. The predefined pattern may further be a plurality of lines of B-stage epoxy on the electrode. The predefined pattern could also be a criss-cross pattern of B-stage epoxy on the electrode.

In additional embodiments of the present invention, a light emitting device die having a mesa configuration on a substrate and an electrode on the mesa is attached to a submount in a flip-chip configuration by forming predefined pattern of conductive die attach material on at least one of the electrode and the submount and mounting the light emitting device die to the submount. The predefined pattern of conductive die attach material is selected so as to prevent the conductive die attach material from contacting sidewalls of the mesa or the substrate when the light emitting device die is mounted to the submount. The predefined pattern of conductive die attach material may provide a volume of die attach material that is less than a volume defined by an area of the electrode and a distance between the electrode and the submount.

In further embodiments of the present invention, the predefined pattern is a single nodule of conductive die attach material on the electrode. The predefined pattern may also be a plurality of bumps of conductive die attach material on the electrode. The predefined pattern may further be a plurality of lines of conductive die attach material on the electrode. The predefined pattern could also be a criss-cross pattern of conductive die attach material on the electrode.

In additional embodiments of the present invention, the conductive die attach material is at least one of a B-stage curable die epoxy, a solder paste, a pattern of solder bumps, and/or a conductive polymer. If the conductive die attach material is solder paste, the predefined pattern may be provided by forming a predefined pattern of solder paste by at least one of screen printing, dispensing and/or pin transferring. If the conductive die attach material is solder bumps, the predefined pattern may be provided by forming a predefined pattern of solder bumps by at least one of dispensing a solder paste and reflowing, electroplating and/or dipping. If the conductive die attach material is a B-stage curable die epoxy and/or a conductive polymer, the predefined pattern may be provided by forming a pattern of a B-stage curable-die epoxy and/or a conductive polymer by screen printing, dispensing, dispensing and reflowing, layering and laser scribing, photolithography and/or pin transferring methods.

In still further embodiments of the present invention, light emitting device die suitable for mounting on a submount includes a conducting substrate, such as a silicon carbide substrate, a gallium nitride based active region on the silicon carbide substrate and a first electrode on the gallium nitride based active region opposite the substrate. In some embodiments, the first electrode and the gallium nitride based active region form a mesa having sidewalls. A second electrode is provided on the silicon carbide substrate opposite the gallium nitride active region. A predefined pattern of conductive die attach material is provided on the first electrode opposite the gallium nitride active region that substantially prevents the conductive die attach material from contacting the sidewalls of the mesa and/or the substrate when the light emitting device die is mounted to the submount.

The predefined pattern of conductive die attach material may provide a volume of die attach material that is less than a volume defined by an area of the first electrode and a distance between the first electrode and the submount. The predefined pattern may be a single nodule of conductive die attach material on the first electrode. The predefined pattern may also be a plurality of bumps of conductive die attach material on the first electrode. The predefined pattern could be a plurality of lines of conductive die attach material on the first electrode. The predefined pattern could also be a criss-cross pattern of conductive die attach material on the first electrode.

The conductive die attach material may be a B-stage curable die epoxy, a solder paste, a pattern of solder bumps, and/or a conductive polymer.

A submount may also be provided. In such a case, the first electrode is mounted to the submount by the predefined pattern of conductive die attach material.

Additional embodiments of the present invention provide a light emitting device die suitable for mounting on a submount that includes a substrate, such as a silicon carbide substrate, a gallium nitride based active region on the substrate and a first electrode on the nitride based active region opposite the substrate. The first electrode and the gallium nitride based active region may form a mesa having sidewalls. A second electrode may be provided on the substrate opposite the gallium nitride active region. The B-stage conductive epoxy is provided on the first electrode opposite the gallium nitride active region.

The B-stage conductive epoxy may be provided in a predefined pattern. The predefined pattern of B-stage conductive epoxy may provide a volume of B-stage conductive epoxy that is less than a volume defined by an area of the first electrode and a distance between the first electrode and the submount. The predefined pattern may be a single nodule of B-stage conductive epoxy on the first electrode. The predefined pattern could also be a plurality of bumps of B-stage conductive epoxy on the first electrode. The predefined pattern may further be a plurality of lines of B-stage conductive epoxy on the first electrode. The predefined pattern could also be a criss-cross pattern of B-stage conductive epoxy on the first electrode.

A submount may also be provided. In such a case, the first electrode is mounted to the submount by the B-stage conductive epoxy.

In further embodiments of the present invention, a light emitting device die includes a gallium nitride based active region having at least one region of a first conductivity type and a first electrode electrically coupled to the gallium nitride based active region. A region of semiconductor material of a second conductivity type is electrically coupled to the gallium nitride based active region. The second conductivity type is opposite to the first conductivity type. A predefined pattern of conductive die attach material is on the first electrode opposite the gallium nitride active region and configured to substantially prevent the conductive die attach material from contacting the region of semiconductor material of a second conductivity type when the light emitting device die is mounted to a submount.

A second electrode may also be provided on the region of semiconductor material of a second conductivity type. A substrate may also be provide and the gallium nitride based active region may be on the substrate. The first electrode and the second electrode may be on opposite sides of the substrate or may be on the same side of the substrate. The substrate may be insulating or conductive. In certain embodiments of the present invention, the substrate is a silicon carbide substrate.

DETAILED DESCRIPTION OF THE PREFERRED EMBODIMENTS

Figure 1:
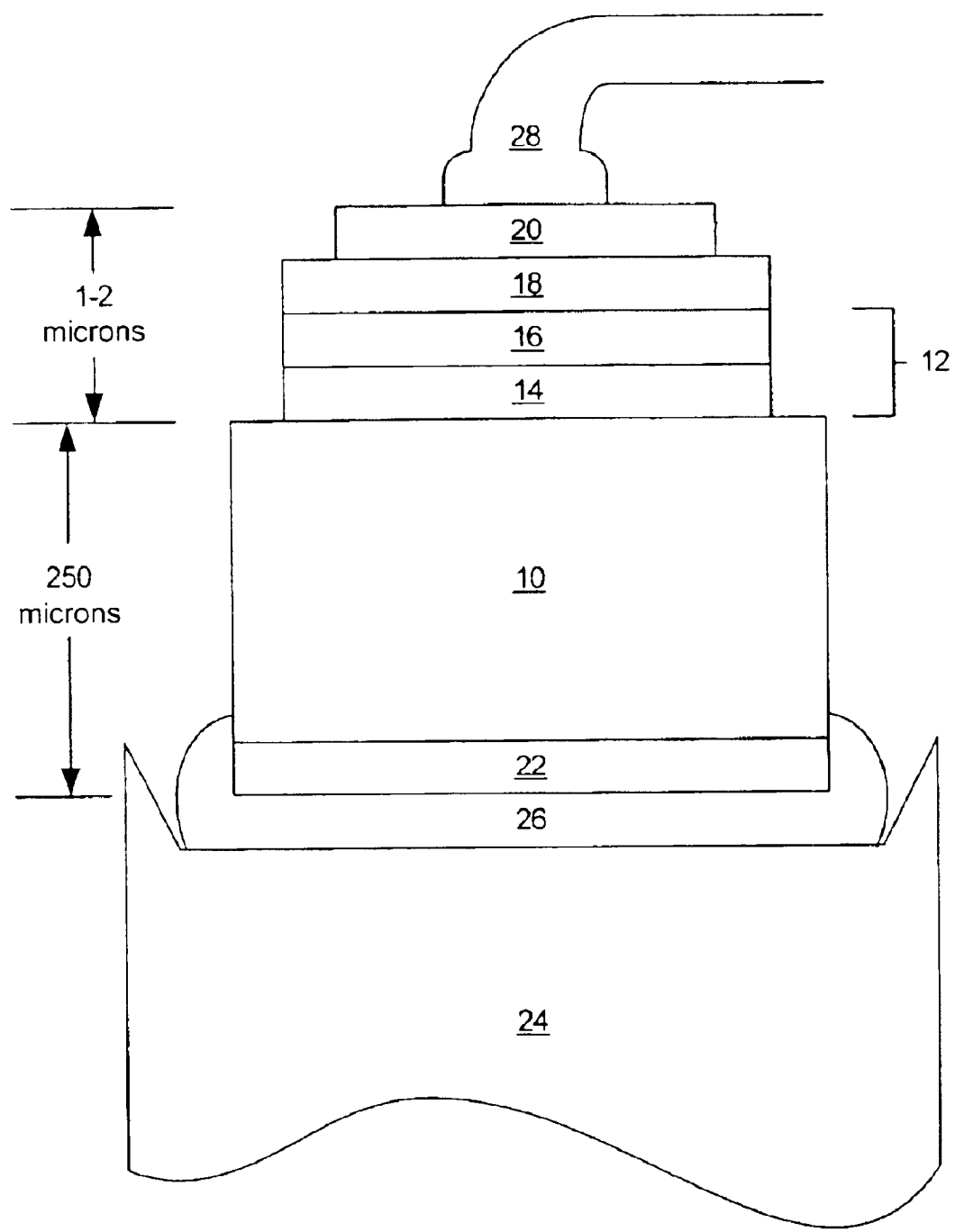
FIG. 1 is a schematic illustration of a conventional LED.
Figure 2:
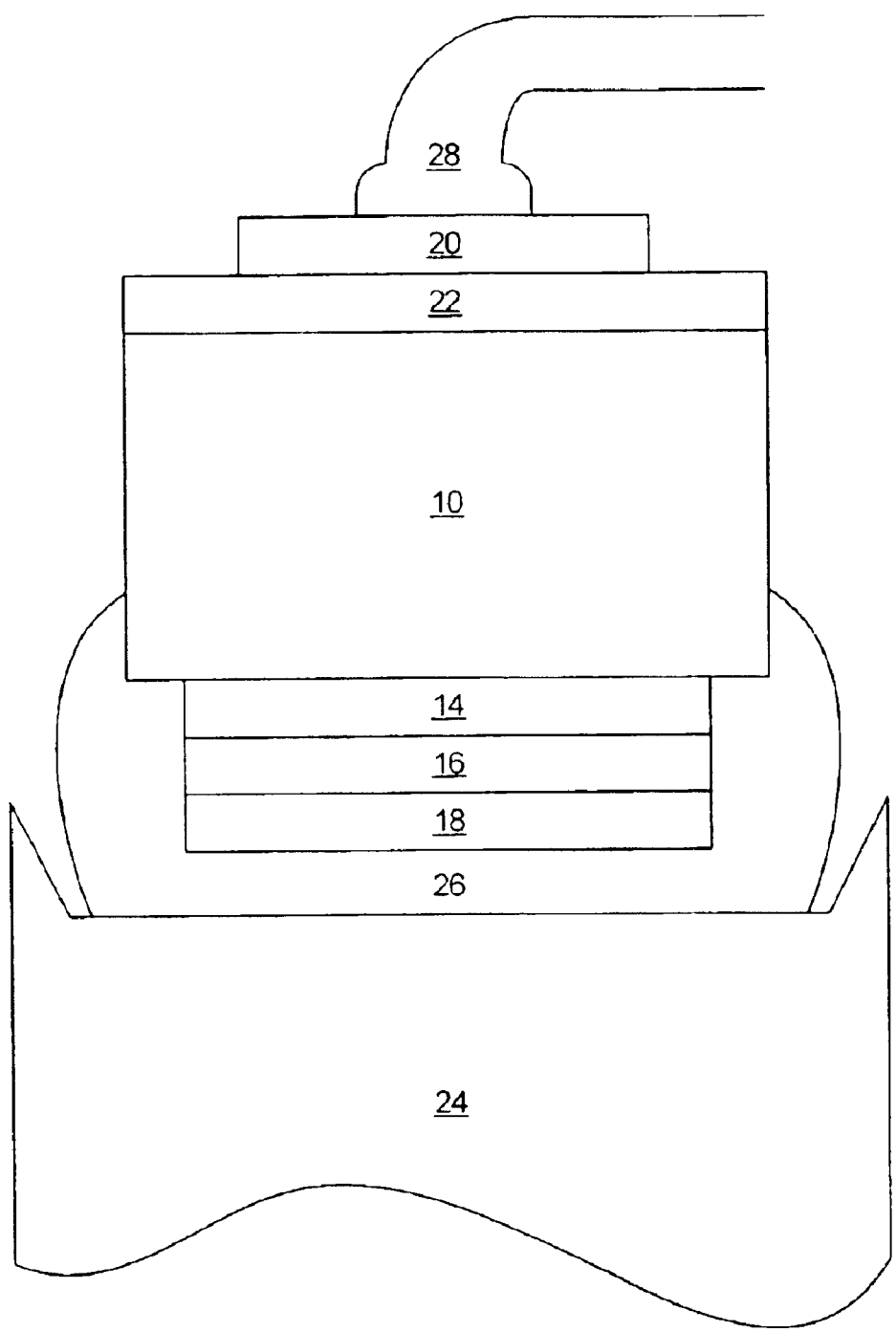
FIG. 2 is a schematic illustration of a flip-chip mounted LED utilizing conventional techniques.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. As will also be appreciated by those of skill in the art, references herein to a layer formed "on" a substrate or other layer may refer to the layer formed directly on the substrate or other layer or on an intervening layer or layers formed on the substrate or other layer. Accordingly, the present invention is not limited to the relative size and spacing illustrated in the accompanying figures.

Embodiments of the present invention provide for connecting a light emitting device having a light emitting element, such as an LED die, to a submount or package in a flip-chip configuration using a die attach material that can be applied to an electrode of the light emitting device, such as the p-electrode, and/or the submount or package prior to packaging the light emitting device. The die attach material can be used to form a conductive attachment between the light emitting device and the submount without forming a parasitic diode that shunts the p-n diode of the device. In some embodiments, the shunt diode may be avoided by preventing the conductive adhesive from substantially flowing during curing. In other embodiments, the shunt diode may be avoided by preventing the conductive adhesive from contacting a region of the device of opposite conductivity type to that of the region to which the conductive adhesive provides a contact. Thus, for example, if the conductive adhesive provides a contact to the p-type contact of the device, the shunt diode may be avoided by preventing the conductive adhesive from contacting an n-type region of the device. If the conductive adhesive provides a contact to the n-type contact of the device, the shunt diode may be avoided by preventing the conductive adhesive from contacting a p-type region of the device.

In further embodiments of the present invention where the conductive adhesive is solder, the conductive adhesive may facilitate heat extraction from the device when the device is mounted in a flip-chip configuration. Such heat extraction may be beneficial for high power devices, such as devices that may be suitable for use in white light applications. Furthermore, while the present invention is described herein primarily with reference to devices having contacts on opposite sides of the device, embodiments of the present invention may also be beneficial for devices having both contacts on the same side of the device. In such a case, the conductive adhesive may provided in a manner where the conductive adhesive of the contact do not form a shunt diode by contacting a regions of the device of opposite conductivity type of that to which the conductive adhesive makes contact. Furthermore, the conductive adhesive of the two contacts should not contact each other.

Embodiments of the present invention are described herein with reference to a GaN based LED on an n-type SiC substrate 10 and having a n-type layer 14, a p-type layer 16 and a p-electrode 18 electrically coupled to the p-type layer. However, the present invention should not be construed as limited to such structures. Thus, references herein to the conductive die attach material shorting to the n-type regions 10 and 14 are provided for illustrative purposes only. Thus, references to shorting to the n-type regions 10 and 14 may be considered as references to other layers in other device structures (for example to quantum well and/or barrier layers in a multi-quantum well device) where unintentional contact with the die attach material would result in impaired performance, reliability or other characteristics of the device.

Light emitting devices for use in embodiments of the present invention may be gallium nitride based LEDs or lasers fabricated on a silicon carbide substrate such as those devices manufactured and sold by Cree, Inc. of Durham, N.C. For example, the present invention may be suitable for use with LEDs and/or lasers as described in U.S. Pat. Nos. 6,201,262, 6,187,606, 6,120,600, 5,912,477, 5,739,554, 5,631,190, 5,604,135, 5,523,589, 5,416,342, 5,393,993, 5,338,944, 5,210,051, 5,027,168, 5,027,168, 4,966,862 and/or 4,918,497, the disclosures of which are incorporated herein by reference as if set forth fully herein. Other suitable LEDs and/or lasers are described in U.S. Provisional Patent Application Ser. No. 60/294,378, entitled "LIGHT EMITTING DIDODE STRUCTURE WITH MULTI-QUANTUM WELL AND SUPERLATTICE STRUCTURE", U.S. Provisional Patent Application Ser. No. 60/294,445, entitled "MULTI-QUANTUM LIGHT EMITTING DIODE STRUCTURE" and U.S. Provisional Patent Application Ser. No. 60/294,308, entitled "LIGHT EMITTING DIDODE STRUCTURE WITH SUPERLATTICE STRUCTURE", each filed May 30, 2001, U.S. patent application Ser. No. 10/140,796, entitled "GROUP III NITRIDE BASED LIGHT EMITTING DIODE STRUCTURES WITH A QUANTUM WELL AND SUPERLATTICE, GROUP III NITRIDE BASED QUANTUM WELL STRUCTURES AND GROUP III NITRIDE BASED SUPERLATTICE STRUCTURES", filed May 7, 2002, as well as U.S. Provisional Patent Application Ser. No. 10/057,82, entitled "LIGHT EMITTING DIODES INCLUDING SUBSTRATE MODIFICATIONS FOR LIGHT EXTRACTION AND MANUFACTURING METHODS THEREFOR" filed Jul. 23, 2001 and U.S. patent application Ser. No. 10/057,82, filed Jan. 25, 2002 entitled "LIGHT EMITTING DIODES INCLUDING SUBSTRATE MODIFICATIONS FOR LIGHT EXTRACTION AND MANUFACTURING METHODS THEREFOR." the disclosures of which are incorporated herein as if set forth fully.

In particular embodiments of the present invention, the light emitting devices may include a p-electrode that provides a reflecting layer to reflect light generated in the active region back through the device. Reflective p-electrodes and related structures are described in U.S. patent application Ser. No. 10/057,82 entitled "LIGHT EMITTING DIODES INCLUDING SUBSTRATE MODIFICATIONS FOR LIGHT EXTRACTION AND MANUFACTURING METHODS THEREFOR" filed Jan. 25, 2002, which is hereby incorporated by reference as if set forth fully herein.

The LEDs and/or lasers may be configured to operate in a "flip-chip" configuration such that light emission occurs through the substrate. In such embodiments, the substrate may be patterned so as to enhance light output of the devices as is described, for example, in U.S. Provisional Patent Application Ser. No. 60/307,235 filed Jul. 23, 2001 entitled "LIGHT EMITTING DIODES INCLUDING SUBSTRATE MODIFICATIONS FOR LIGHT EXTRACTION AND MANUFACTURING METHODS THEREFOR" and U.S. patent application Ser. No. 10/057,82 filed Jan. 25, 2002 entitled entitled "LIGHT EMITTING DIODES INCLUDING SUBSTRATE MODIFICATIONS FOR LIGHT EXTRACTION AND MANUFACTURING METHODS THEREFOR."

Figure 3A:
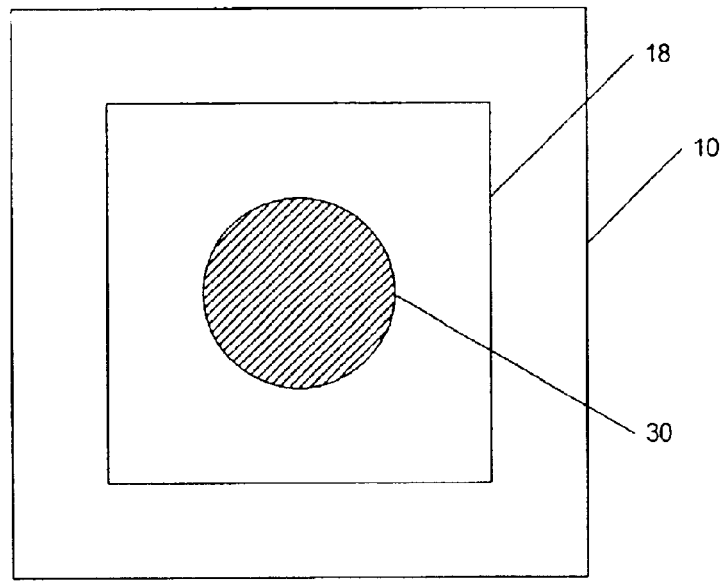
FIGS. 3A, 3B, 3C and 3D are illustrations of patterns of die attach material according to various embodiments of the present invention.
Figure 3B:
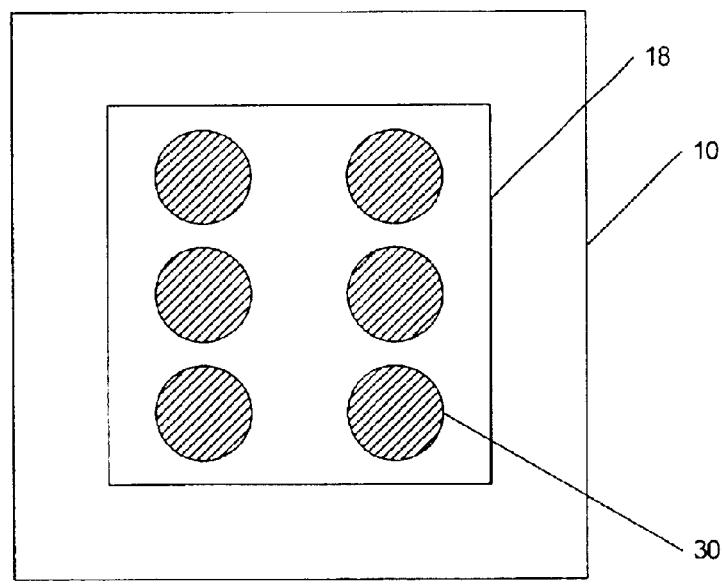
Figure 3C:
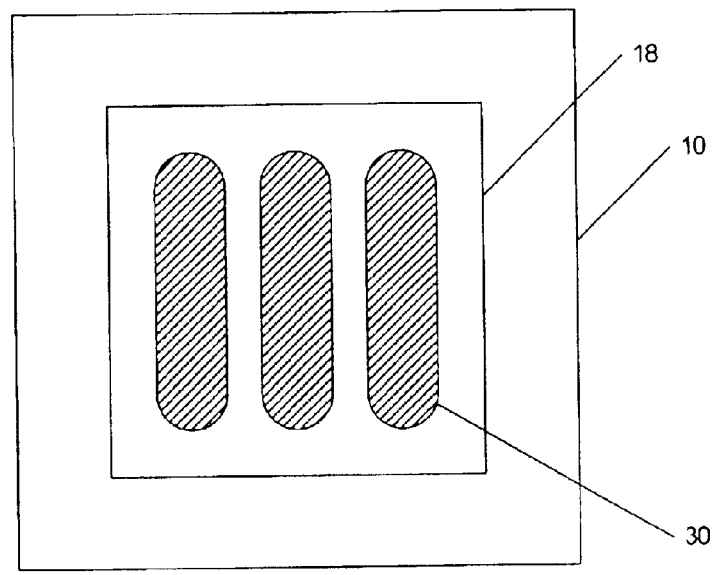
Figure 3D:
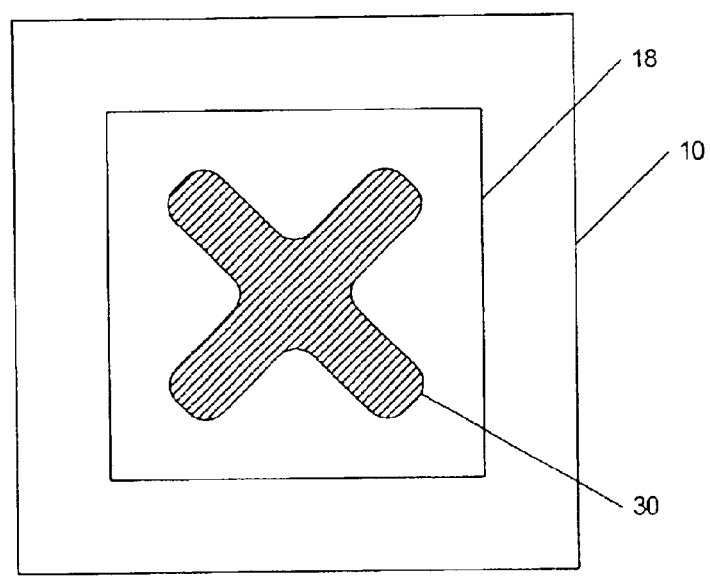

In particular embodiments of the present invention, the die attach material may be provided in a pattern on the p-electrode of a gallium nitride based light emitting device formed on a silicon carbide substrate. As used herein, the term pattern means that the die attach material covers some, but not all, of the surface on which it is placed. In such embodiments, the pattern may be selected so as to substantially prevent the conductive die attach material from flowing to the sidewalls of the gallium nitride device so as to short the active region of the device. In other embodiments, the pattern may be selected to prevent the conductive adhesive from substantially flowing during curing/bonding. Examples of suitable patterns of conductive die attach material are shown in FIGS. 3A–3D. As seen in FIG. 3A, a single nodule of die attach material 30 is provided on a p-electrode 18 of a light emitting device on the substrate 10. FIG. 3B shows die attach material 30 formed in an array of nodules on the p-electrode 18. FIG. 3C shows die attach material 30 formed in an array of lines on the p-electrode 18. FIG. 3D shows die attach material 30 formed in a criss-cross or "X" pattern on the p-electrode 18. Other patterns may be employed without departing from the invention. In some embodiments, the pattern of conductive die attach material provides a volume of die attach material which is less than a volume defined by the area of the p-electrode of the light emitting device and the distance between the light emitting device and the submount.

The particular technique for providing a pattern of conductive die attach material may depend on the conductive die attach material. Suitable die attach materials include a B-stage curable die epoxy (or a "B-stage epoxy"), a solder paste, a pattern of solder bumps, and/or a conductive polymer. Embodiments of the invention include methods of applying a die attach material to an LED die or wafer and further include an LED die having deposited thereon a die attach material. Additional embodiments include methods of patterning a die attach material on an LED die or applying a patterned die attach material to an LED die or wafer, and further include the resulting LED die.

As discussed above, the die attach material may comprise a standard B-stage epoxy. Such epoxies are available commercially from, for example, Emerson Cumming, Ablestik, Dexter, Diemat and Epotek. In particular, Ablestik's RP333-3 epoxy, Dexter's BMI-519 epoxy and Emerson and Cumming's LA-9843-28 epoxy are suitable B-stage epoxies. In some embodiments of the present invention, the epoxy has the following characteristics:

B stage curable;
Electrically conductive;
Able to withstand water (during subsequent wafer sawing operations); and
Sufficient physical strength to withstand subsequent processing operations (e.g. mounting and demounting from a tape).

In other embodiments, the B-stage epoxy need not be electrically conductive, and a separate electrically conductive path may be provided. The die attach material may comprise a conductive polymer such as CB028 manufactured by DuPont.

Figure 4:
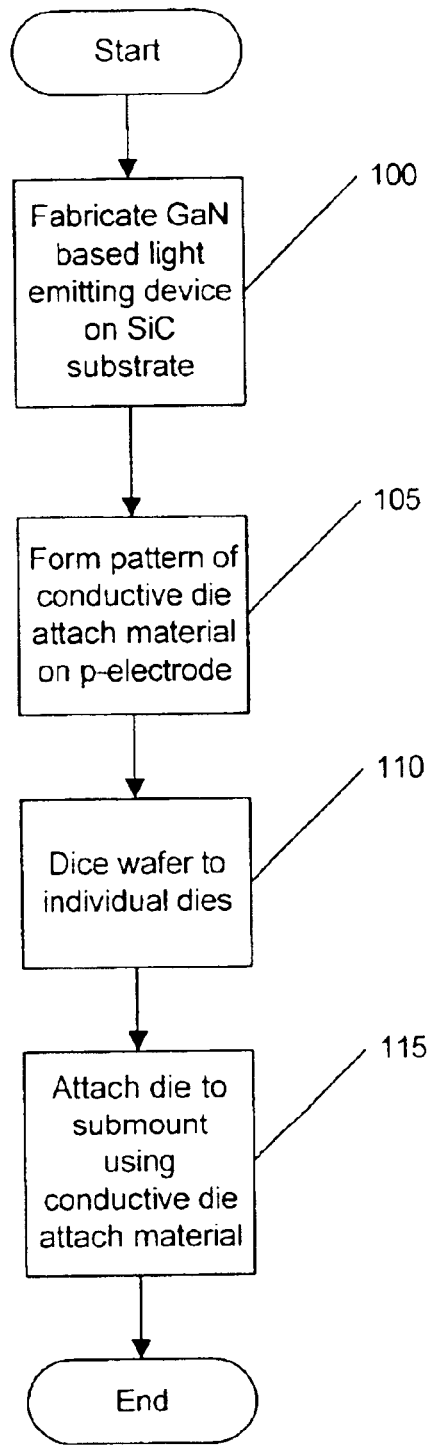
FIG. 4 is a flowchart illustrating operations according to embodiments of the present invention.

Operations for fabricating light emitting device dies according to embodiments of the present invention will now be described with reference to the flowchart of FIG. 4. As seen in FIG. 4, a GaN based light emitting device, such as those described above, is fabricated on a SiC substrate (block 100). In such fabrication, after deposition of the desired epitaxial layers on a SiC wafer but prior to dicing, ohmic contacts are formed on opposite sides of the wafer. The wafer is patterned into LEDs, for example, by etching to form a plurality of mesas. In some embodiments, a passivation layer is formed to protect the epitaxial layers such as described in U.S. Provisional Patent Application Serial No. 60/352,941, filed Jan. 30, 2002 and entitled "LED DIE ATTACH METHODS AND RESULTING STRUCTURES", the disclosure of which is incorporated herein by reference as if set forth fully herein. However, even in such embodiments, using conventional methods the possibility may exist that the die attach material may contact the substrate, for example, at a portion where the substrate has been sawn or broken and, thereby form a shunt diode. Similarly, if the passivation layer is somehow damaged, for example at a region where the substrate is broken, a contact could unintentionally be made in such areas.

After fabrication of the light emitting devices, the die attach material is formed in a predefined pattern on the p-electrode of the LEDs (block 105). If a B-stage epoxy or conductive polymer is used, it may be deposited using any of the following techniques (or a combination of techniques, if desired):

Screen printing. In these embodiments, the B-stage epoxy or polymer is applied to the p-electrodes by screen printing using automated vision control. Screen printing and machine vision systems are well known in the art and, therefore, will not be described further herein. A suitable screen printing machine for this application is the SPM screen printer manufactured by MPM corporation. If screen printing is used, the epoxy should be capable of being screen printed at appropriate dimensions. In some embodiments, the epoxy may be screen printable with a minimum feature size of about 4 mils.

Dispensing. In these embodiments, the B-stage epoxy is dispensed directly from a source onto the desired locations on the wafer or submount. These embodiments may be used depending on the type of epoxy used and may include pin transfer, pneumatic dispensing and/or positive displacement dispensing via an auger or piston action.

Layering and laser scribing. In these embodiments, the p-electrode side of the wafer is coated entirely with a B-stage epoxy, and laser scribing is used to selectively remove unwanted epoxy.

Photolithography. In these embodiments, a photosensitive B-stage epoxy is applied to the p-electrode side of the wafer and photolithographic techniques are used to selectively remove unwanted epoxy.

Other techniques for selectively providing a pattern of B-stage epoxy may also be utilized.

Once the B-stage epoxy has been deposited, it is pre-cured to cause it to solidify. Typical heat ranges for pre-curing are 50–150° C. Preferably, the pre-curing occurs at temperatures below 85° C. to avoid damaging other materials used in the manufacturing process such as a mounting tape.

As mentioned above, other conductive die attach materials may also be utilized in certain embodiments of the present invention. For example, solder paste may be used as the die attach material. Solder paste generally includes a solder metal or alloy such as Au/Ge, Pb/Sn, Au/Sn or In mixed together with solvents and/or binders to form a paste. Solder paste may be applied by screen printing, dispensing or pin transferring as described above in connection with epoxies. In particular embodiments of the present invention where solder is used as the die attach material, pin transferring techniques may be used to provide a solder dot as the pattern of the die attach material. For example, a solder dot of about 0.2 mm formed by pin transfer techniques may be used to attach the device to the submount.

Similarly, the die attach material may comprise solder bumps formed on the p-electrode. Solder bumps generally includes solder metal without binders or solvents, and may be deposited by, for example, dispensing a solder paste and subsequent reflow, electroplating and/or dipping.

In any event, after the conductive die attach material pattern is provided on the p-electrodes of the devices on the wafer, the wafer is swan and/or sawn and broken using conventional techniques to separate the individual dies (block 110). Since the sawing may be done under a flow of de-ionized (DI) water, in some embodiments the conductive die attach material, such as the B-stage epoxy, is able to withstand water as well as the mechanical stress imparted from sawing and breaking. The individual die may then be secured onto adhesive tape rolls to facilitate automated packaging. Additionally, unitized groups of dies may be provided as described in U.S. patent application Ser. No. 10/058,369 filed Jan. 28, 2002, entitled "CLUSTER PACKAGING OF LIGHT EMITTING DIODES," the disclosure of which is incorporated herein by reference as if set forth fully herein.

Individual dies may then be attached to a submount utilizing the conductive die attach material on the p-electrode (block 115). For example, when the final packaging is performed for a die (i.e. the die is mounted onto the submount or package) utilizing a B-stage epoxy as the conductive die attach material, the die may be set in place on the submount and heated to a final curing temperature (typically in excess of 150° C.). This causes the epoxy to re-flow and create a permanent connection between the LED chip and the submount. However, because of the conductive die attach material utilized, the pattern of the material on the p-electrode and/or the pressure used during bonding, the conductive material does not flow onto the sidewalls of the mesa and/or the substrate of the device thereby creating a shunt diode in parallel with the active region of the device. A wirebond connection is then made to the n-electrode.

While FIG. 4 illustrates embodiments of the present invention where the die attach material is provided on the p-electrode of the device, alternatively, the die attach material may be applied directly to the package or submount in a desired pattern or to both the submount and the p-electrode. In such embodiments, the submount is heated to the final curing temperature and the LED chip is pressed onto the submount. Since a B-stage epoxy is used instead of the less viscous conventional epoxies, there is less likelihood of contacting the n-type layers of the active region of the device with the epoxy.

Figure 5:
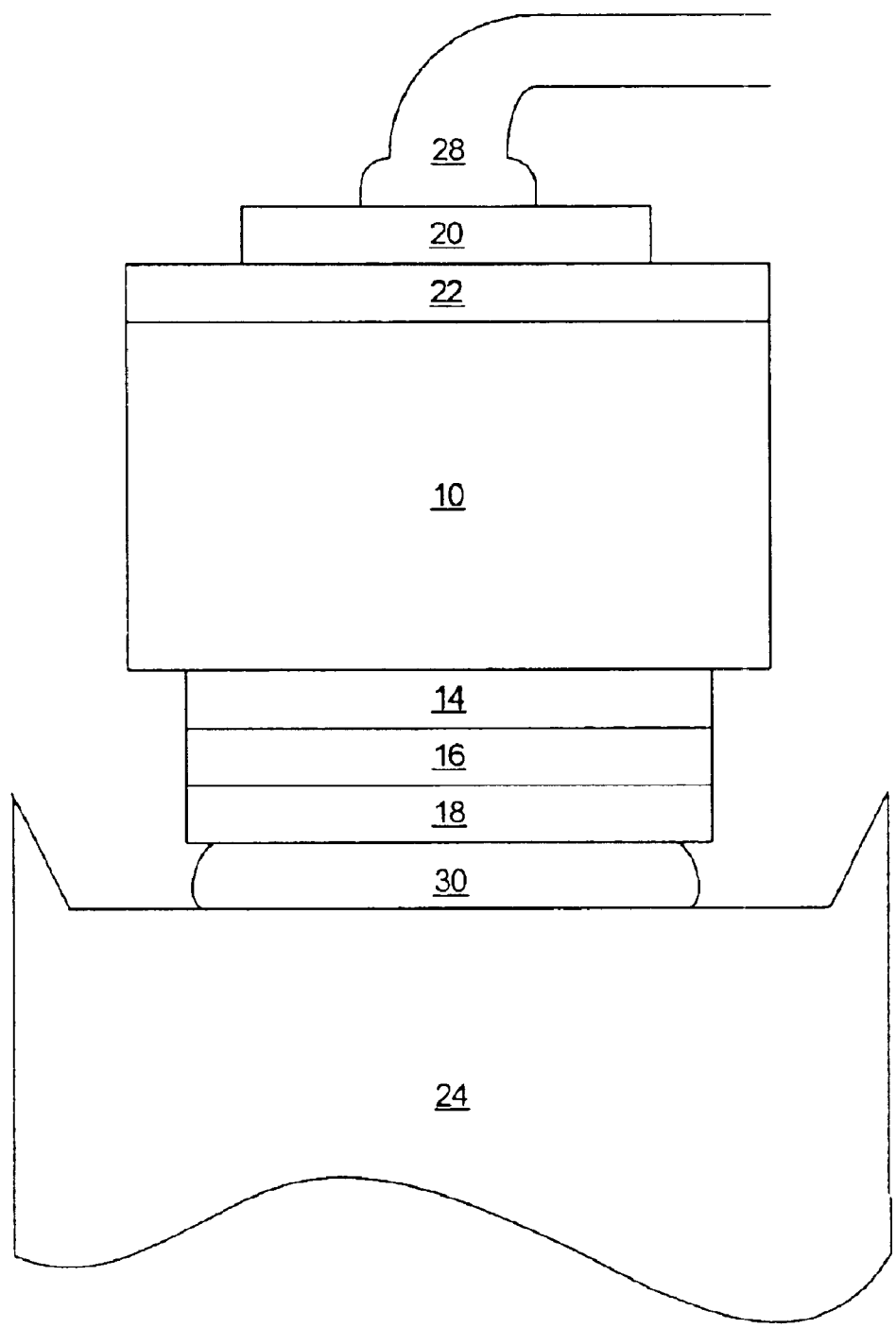
FIG. 5 is an illustration of an LED attached to a submount according to embodiments of the present invention.

FIG. 5 illustrates an LED mounted in accordance with embodiments of the present invention. As shown in FIG. 5, the die attach material epoxy 30 is disposed between the p-electrode 18 and the submount 24 but does not contact the n-type layer 14 or the substrate 10 of the device. Thus, the volume of the die attach material 30 is less than the volume defined by the area of the p-electrode 18 and the distance between the p-electrode 18 and the submount 24.

Figure 6:
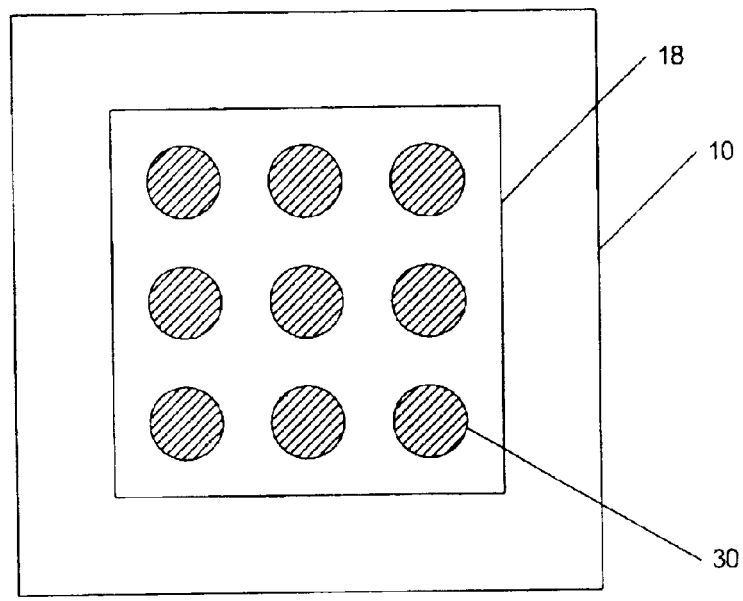
FIG. 6 is a planar view of an LED with a p-type electrode having die attach material bumps in a pattern according to embodiments of the present invention.
Figure 7:
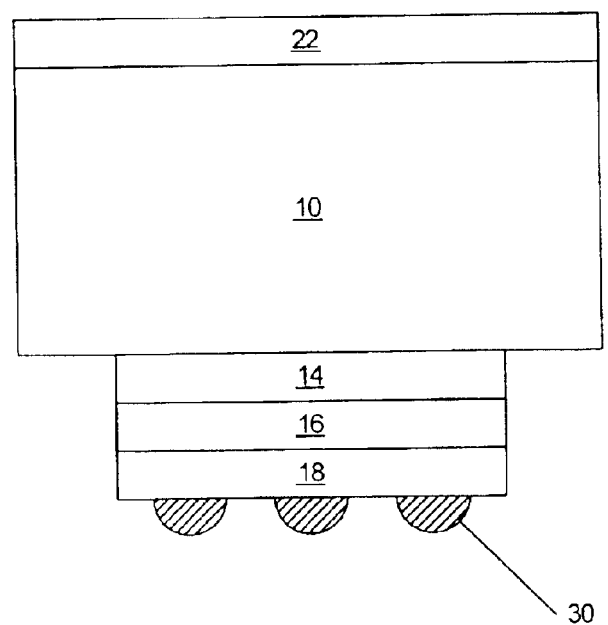
FIG. 7 is a side view of the LED of FIG. 6.

FIG. 6 illustrates a substrate 10 and a p-electrode 18 of a light emitting device on which an array of bumps of conductive die attach material 30 have been formed, such as through deposition, patterning, plating and/or other techniques. FIG. 7 illustrates the light emitting device of FIG. 6 in elevation. After deposition of the bumps 30 the LED is placed on a submount and the device is heated at a temperature sufficient to reflow the bumps 30. In some embodiments, flux may also applied as part of the reflow process. The reflow temperature depends on the particular metal or alloy used. For example, alloys containing a high percentage of Sn may have a melting point below 200° C., while alloys having a low percentage of Sn may have a melting point above 350° C. In some embodiments, while the bumps are at an increased temperature, surface tension keeps the bumps from outflowing and wetting the n-type layer 14 or the substrate 10 of the LED. In other embodiments, non-wettable patterns and/or solder dams may be used to control outflow.

Figure 8:
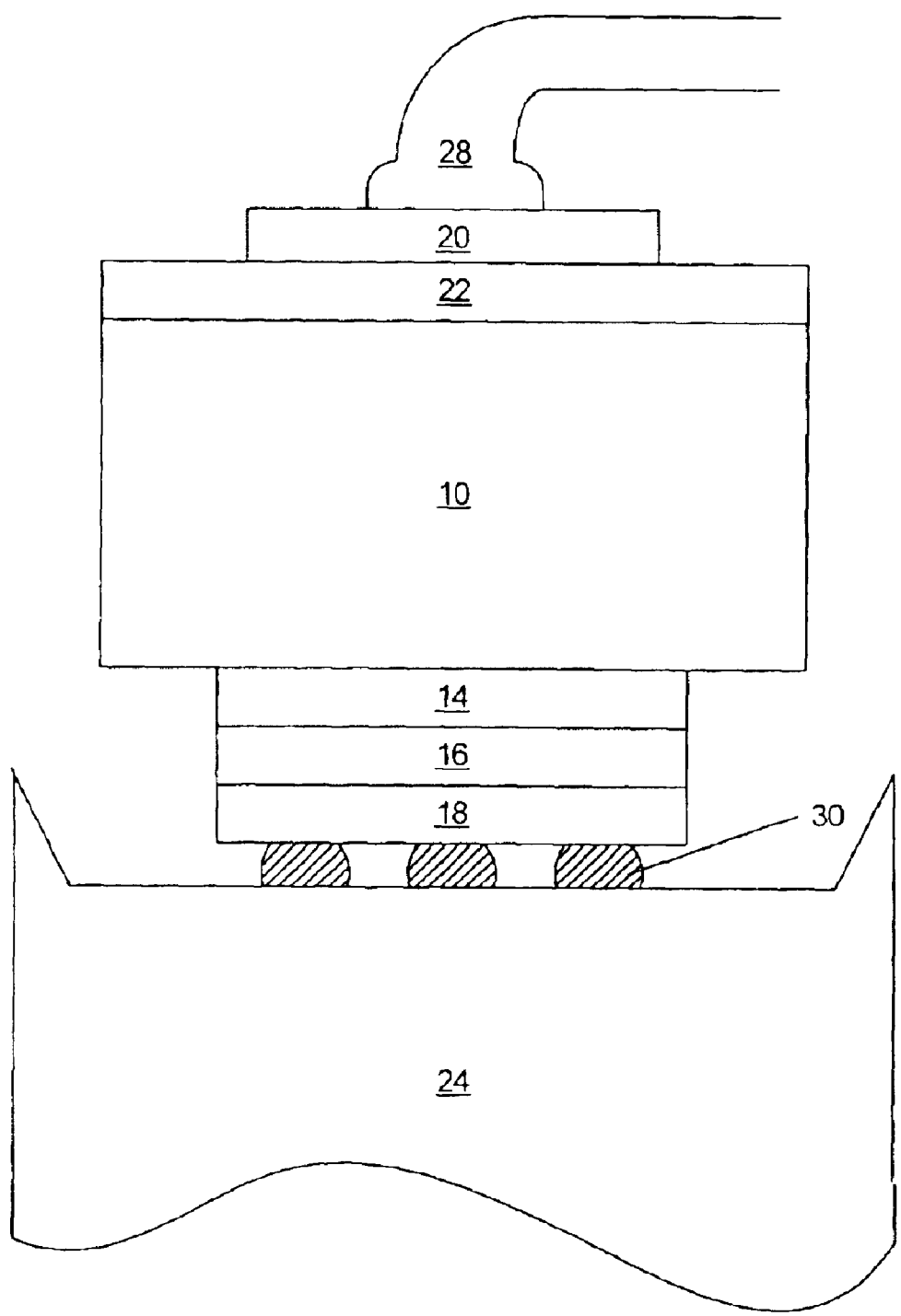
FIG. 8 is a side view of the LED of FIGS. 6 and 7 after mounting to the submount.

After the bumps have been melted the device is cooled, thereby bonding the LED to the submount 24. FIG. 8 illustrates an LED mounted in accordance with these embodiments of the present invention. As seen in FIG. 8, the bumps of die attach material epoxy 30 are disposed between the p-electrode 18 and the submount 24 but do not contact the n-type layer 14 or the substrate 10 of the device. Thus, the volume of the die attach material 30 (e.g. the solder bumps) is less than the volume defined by the area of the p-electrode 18 and the distance between the p-electrode 18 and the submount 24. Therefore, no Schottky diode connection is made between the solder bumps and the n-type portions of the LED.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A light emitting device die, comprising:
   a conducting substrate;
   a gallium nitride based active region on the conducting substrate;
   a first electrode on the nitride based active region opposite the conducting substrate, the first electrode and the gallium nitride based active region forming a mesa having sidewalls;
   a second electrode on the conducting substrate opposite the gallium nitride active region; and
   a predefined pattern of conductive die attach material on the first electrode opposite the gallium nitride active region that substantially prevents the conductive die attach material from contacting at least one of the sidewalls of the mesa and the substrate when the light emitting device die is mounted to a submount.

2. The die of claim 1, wherein the conducting substrate comprises a silicon carbide substrate.

3. The die of claim 1, wherein the predefined pattern of conductive die attach material provides a volume of die attach material that is less than a volume defined by an area of the first electrode and a distance between the first electrode and the submount.

4. The die of claim 1, wherein the predefined pattern comprises a single nodule of conductive die attach material on the first electrode.

5. The die of claim 1, wherein the predefined pattern comprises a plurality of bumps of conductive die attach material on the first electrode.

6. The die of claim 1, wherein the predefined pattern comprises a plurality of lines of conductive die attach material on the first electrode.

7. The die of claim 1, wherein the predefined pattern comprises a criss-cross pattern of conductive die attach material on the first electrode.

8. The die of claim 1, wherein the conductive die attach material comprises at least one of a B-stage curable die epoxy, a solder paste, a pattern of solder bumps, and/or a conductive polymer.

9. The die of claim 1, further comprising a submount, wherein the first electrode is mounted to the submount by the predefined pattern of conductive die attach material.

10. A light emitting device die, comprising: a substrate;
a gallium nitride based active region on the substrate;
a first electrode on the nitride based active region opposite the substrate;
a B-stage conductive epoxy on the first electrode opposite the gallium nitride active region.

11. The die of claim 10, wherein the first electrode and the gallium nitride based active region form a mesa having sidewalls.

12. The die of claim 10, wherein the substrate is a conducting substrate, the die further comprising a second electrode on the conducting substrate opposite the gallium nitride active region.

13. The die of claim 10, wherein the substrate is an insulating substrate, the die further comprising a second electrode on the conducting substrate on a same side of the substrate as the gallium nitride active region.

14. The die of claim 10, wherein the conducting substrate comprises a silicon carbide substrate.

15. The die of claim 10, wherein the B-stage conductive epoxy is on the first electrode in a predefined pattern.

16. The die of claim 15, wherein the predefined pattern of conductive die attach material provides a volume of die attach material that is less than a volume defined by an area of the first electrode and a distance between the first electrode and the submount.

17. The die of claim 15, wherein the predefined pattern comprises a single nodule of B-stage conductive epoxy on the first electrode.

18. The die of claim 15, wherein the predefined pattern comprises a plurality of bumps of B-stage conductive epoxy on the first electrode.

19. The die of claim 15, wherein the predefined pattern comprises a plurality of lines of B-stage conductive epoxy on the first electrode.

20. The die of claim 15, wherein the predefined pattern comprises a criss-cross pattern of B-stage conductive epoxy on the first electrode.

21. The die of claim 10, further comprising a submount, wherein the first electrode is mounted to the submount by the B-stage conductive epoxy.

22. A light emitting device die for flip-chip mounting, comprising:

a gallium nitride based active region having at least one region of a first conductivity type;
a first electrode electrically coupled to the gallium nitride based active region;
a region of semiconductor material of a second conductivity type electrically coupled to the gallium nitride based active region, the second conductivity type being opposite to the first conductivity type; and
a predefined pattern of conductive die attach material on the first electrode opposite the gallium nitride active region, the predefined pattern being configured to substantially prevent the conductive die attach material from contacting the region of semiconductor material of a second conductivity type when the light emitting device die is mounted to a submount.

23. The die of claim 22, further comprising a second electrode on the region of semiconductor material of a second conductivity type.

24. The die of claim 23, further comprising a substrate, wherein the gallium nitride based active region is on the substrate.

25. The die of claim 24, wherein the first electrode and the second electrode are on opposite sides of the substrate.

26. The die of claim 24, wherein the first electrode and the second electrode are on a same side of the substrate.

27. The die of claim 24, wherein the substrate comprises a silicon carbide substrate.

28. The die of claim 22, wherein the predefined pattern of conductive die attach material provides a volume of die attach material that is less than a volume defined by an area of the first electrode and a distance between the first electrode and the submount.

29. The die of claim 22, wherein the predefined pattern comprises a single nodule of conductive die attach material on the first electrode.

30. The die of claim 22, wherein the conductive die attach material comprises solder.

31. The die of claim 22, wherein the predefined pattern comprises a plurality of bumps of conductive die attach material on the first electrode.

32. The die of claim 22, wherein the predefined pattern comprises a plurality of lines of conductive die attach material on the first electrode.

33. The die of claim 22, wherein the predefined pattern comprises a criss-cross pattern of conductive die attach material on the first electrode.

34. The die of claim 22, wherein the conductive die attach-material comprises at least one of a B-stage curable die epoxy, a solder paste, a pattern of solder bumps, and/or a conductive polymer.

35. The die of claim 22, further comprising a submount, wherein the first electrode is mounted to the submount by the predefined pattern of conductive die attach material.

* * * * *